(12) United States Patent
Li et al.

(10) Patent No.: US 10,998,062 B2
(45) Date of Patent: May 4, 2021

(54) METHOD FOR PROGRAMMING A MEMORY SYSTEM

(71) Applicant: Yangtze Memory Technologies Co., Ltd., Wuhan (CN)

(72) Inventors: Haibo Li, Wuhan (CN); Qiang Tang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 186 days.

(21) Appl. No.: 16/248,719

(22) Filed: Jan. 15, 2019

(65) Prior Publication Data

US 2020/0185046 A1   Jun. 11, 2020

Related U.S. Application Data

(63) Continuation of application No. PCT/CN2018/119801, filed on Dec. 7, 2018.

(51) Int. Cl.

| G11C 16/34 | (2006.01) |
| G11C 16/10 | (2006.01) |
| G11C 16/32 | (2006.01) |
| G11C 16/14 | (2006.01) |
| G11C 16/04 | (2006.01) |
| G11C 11/56 | (2006.01) |

(52) U.S. Cl.
CPC ...... *G11C 16/3431* (2013.01); *G11C 16/0408* (2013.01); *G11C 16/10* (2013.01); *G11C 16/14* (2013.01); *G11C 16/32* (2013.01); *G11C 16/349* (2013.01); *G11C 16/3459* (2013.01); *G11C 11/5628* (2013.01); *G11C 11/5635* (2013.01); *G11C 2211/5621* (2013.01)

(58) Field of Classification Search
CPC .............. G11C 16/107; G11C 11/5628; G11C 16/0483; G11C 2211/5621
See application file for complete search history.

(56) References Cited

U.S. PATENT DOCUMENTS

| 5,321,699 A | * | 6/1994 | Endoh ................. G11C 11/5628 365/185.17 |
| 5,602,789 A | * | 2/1997 | Endoh ................. G11C 11/5621 365/185.03 |
| 6,778,442 B1 | | 8/2004 | Hamilton |

(Continued)

FOREIGN PATENT DOCUMENTS

| CN | 1777959 A | 5/2006 |
| CN | 101114530 A | 1/2008 |

(Continued)

*Primary Examiner* — Tuan T Nguyen
(74) *Attorney, Agent, or Firm* — Winston Hsu

(57) ABSTRACT

A memory system includes a plurality of blocks of memory blocks, each including a plurality of memory cells. The method for programming the memory system includes during a program process, performing a first program operation to program a first memory block, waiting for a delay time after the first program operation is completed, after waiting for the delay time, performing an all-level threshold voltage test to determine if threshold voltages of the first memory block are greater than corresponding threshold voltages, and performing a second program operation to program the first memory block according to a result of the all-level threshold voltage test.

12 Claims, 3 Drawing Sheets

(56) References Cited

U.S. PATENT DOCUMENTS

| | | | |
|---|---|---|---|
| 7,227,783 B2 * | 6/2007 | Li | G11C 16/10 365/185.18 |
| 7,307,887 B2 * | 12/2007 | Chen | G11C 11/5628 360/53 |
| 7,471,562 B2 | 12/2008 | Hung | |
| 7,474,561 B2 | 1/2009 | Li | |
| 7,577,034 B2 | 8/2009 | Lee | |
| 7,738,296 B2 | 6/2010 | Lin | |
| 8,644,082 B2 | 2/2014 | Baek | |
| 10,319,460 B2 | 6/2019 | Kern | |
| 2008/0285368 A1 | 11/2008 | Hung | |
| 2011/0292724 A1 | 12/2011 | Kim | |
| 2015/0199231 A1 | 7/2015 | Tressler | |

FOREIGN PATENT DOCUMENTS

| | | |
|---|---|---|
| CN | 101308703 A | 11/2008 |
| CN | 101351849 A | 1/2009 |
| CN | 100472661 C | 3/2009 |
| CN | 101458965 A | 6/2009 |
| CN | 101501781 A | 8/2009 |
| CN | 101584003 A | 11/2009 |
| CN | 101673229 A | 3/2010 |
| CN | 102298966 A | 12/2011 |
| CN | 102651236 A | 8/2012 |
| CN | 103488579 A | 1/2014 |
| CN | 104376873 A | 2/2015 |

* cited by examiner

METHOD FOR PROGRAMMING A MEMORY SYSTEM

CROSS REFERENCE TO RELATED APPLICATIONS

This application is a continuation of International Application No. PCT/CN2018/119801 filed on Dec. 7, 2018, the entire contents of which are incorporated herein by reference.

BACKGROUND OF THE INVENTION

1. Field of the Invention

The present invention is related to a method for programming a memory system, and more particularly, to a method for programming a memory system to reduce the retention error.

2. Description of the Prior Art

NAND flash memory is a type of non-volatile storage medium that has been widely used in many fields including notebook, mobile phones, and hard drive. However, the data stored in NAND flash memory may not always be stable and fixed. For example, as the flash memory cells lose charges over time, the data stored in the flash memory cells may be changed and become invalid. The retention error would be even more tricky when the flash memory cells are multiple-level cells (MLC).

One of the reasons that cause the retention error is called the instant (or initial) threshold voltage (Vt) shift (IVS), which means that the threshold voltage raised by the program operation may drop within a short period of time after the program operation. Sometimes, the IVS can be as significant as 200 mV to 300 mV. In this case, the read margin will be reduced, and the data stored in some of the flash memory cells may become invalid.

SUMMARY OF THE INVENTION

One embodiment of the present invention discloses a method for programming a memory system. The memory system includes a plurality of memory blocks, each including a plurality of memory cells.

The method includes during a program process, performing a first program operation to program a first memory block of the plurality of memory blocks, waiting for a delay time after the first program operation is completed, after waiting for the delay time, performing an all-level threshold voltage test to determine if threshold voltages of memory cells in the first memory block are greater than corresponding threshold voltages, and performing a second program operation to program the first memory block according to a result of the all-level threshold voltage test.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
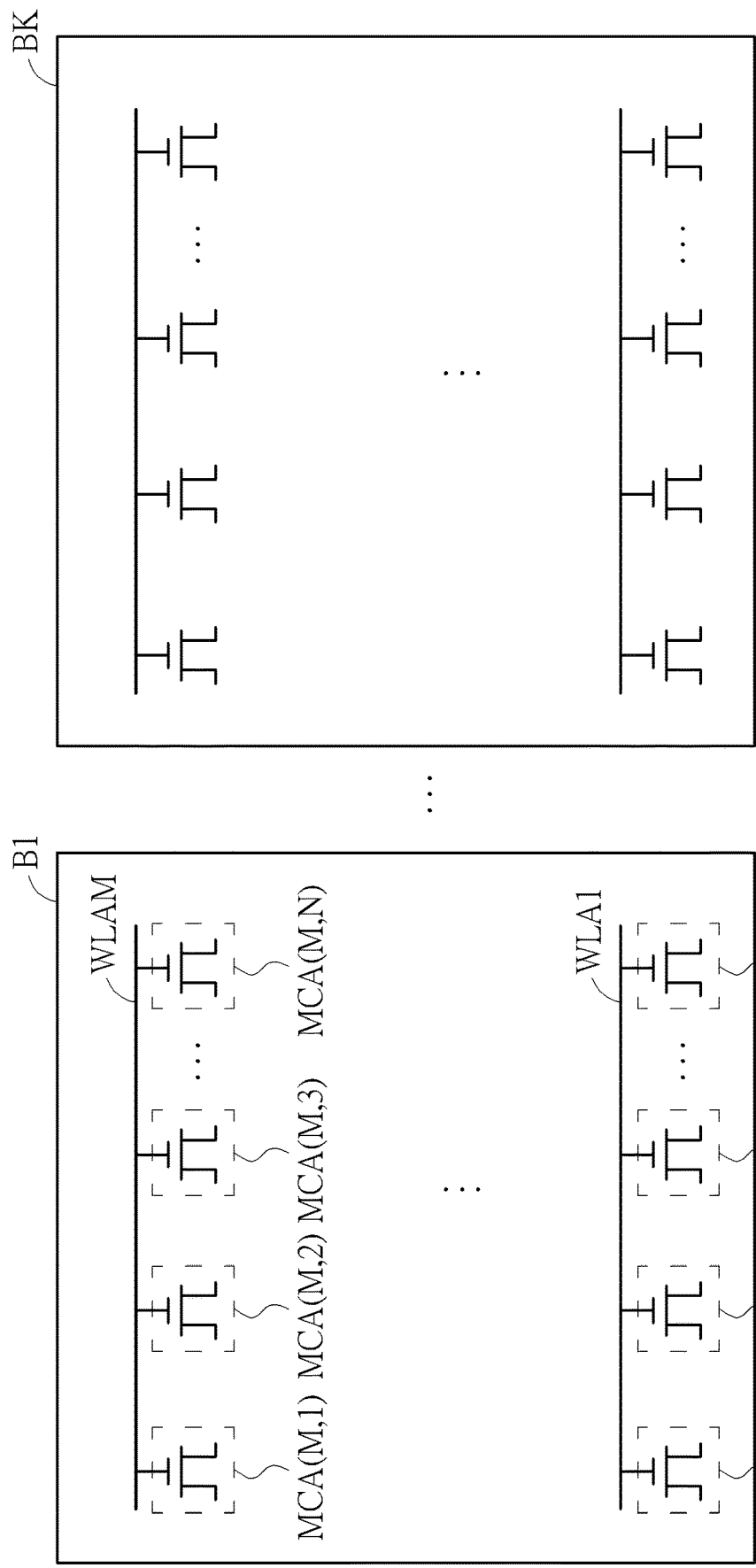
FIG. 1 shows a memory system according to one embodiment of the present invention.

FIG. 1 shows a memory system 100 according to one embodiment of the present invention. The memory system 100 includes a plurality of memory blocks B1 to BK, and each of the memory blocks B1 to BK includes a plurality of memory cells. In some embodiments of the present invention, the memory system 100 can be a flash memory, such as a NAND type flash memory.

In FIG. 1, each of the memory blocks B1 to BK can include the same number of memory cells. For example, the memory block B1 can include M×N memory cells MCA(1, 1) to MCA(M,N) with every N memory cells coupled to the same corresponding word line of the M word lines WLA1 to WLAM, where M and N are positive integers greater than 1.

In some embodiments, the memory cells MCA(1,1) to MCA(M,N) can be multiple-level cells (MLC), including quad-level cells (QLC) and triple-level cells (TLC). That is, each of the memory cells MCA(1,1) to MCA(M,N) can store data of multiple bit states.

For example, each of the memory cells MCA(1,1) to MCA(M,N) can include a floating gate transistor FT. During a program operation of the memory cells MCA(1,1) to MCA(M,N), the gate terminals of the floating gate transistor FT of the memory cells MCA(1,1) to MCA(M,N) can receive a program voltage from the word lines WLA1 to WLAM, and the first terminals of the floating gate transistors FT of the memory cell MCA(1,1) to MCA(M,N) can receive a reference voltage. In some embodiments, the program voltage can be greater than the reference voltage, and thus the high cross voltage between the gate terminals and the first terminals of the floating gate transistors FT will inject electrons to the gate structures of the floating gate transistors FT, increasing the threshold voltage of the floating gate transistors FT.

By injecting sufficient electrons to the gate structures of the floating gate transistors FT, the threshold voltages of the floating gate transistors FT will be raised to the desired levels. Consequently, the state of data stored in the memory cells MCA(1,1) to MCA(M,N) can be identified according to the levels of the threshold voltages of the floating gate transistors FT of the memory cells MCA(1,1) to MCA(M, N).

However, after the memory cells MCA(1,1) to MCA(M, N) are programmed with the desired levels of threshold voltages, the threshold voltages of the memory cells MCA (1,1) to MCA(M,N) may be dropped within a short period of time, which is the so called instant threshold voltage shift (or initial threshold voltage shift). The instant threshold voltage shift may result in the threshold voltages of some of the memory cells MCA(1,1) to MCA(M,N) dropping below the verification voltage, thereby causing the data stored in some of the memory cells MCA(1,1) to MCA(M,N) to be invalid.

Figure 2:
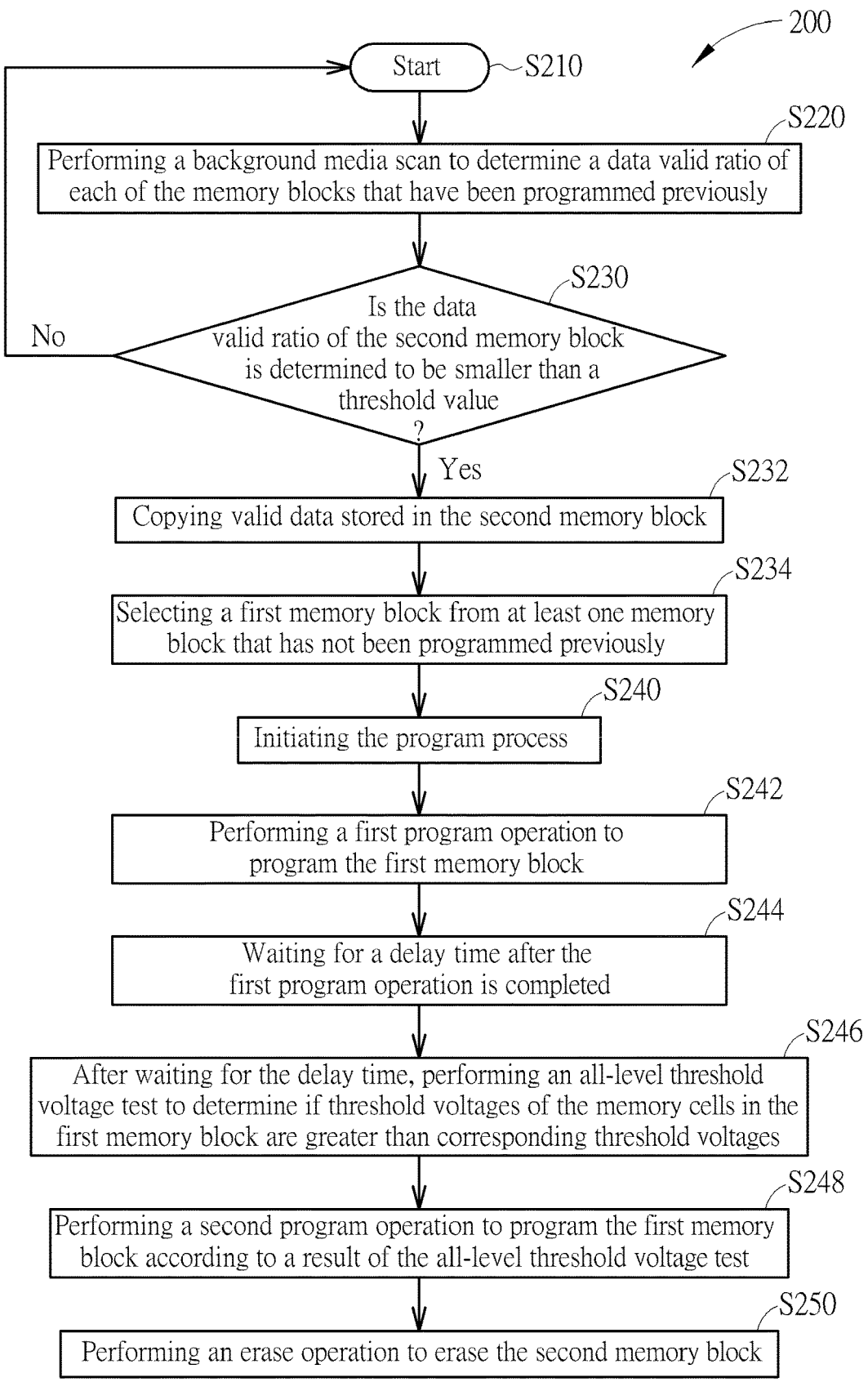
FIG. 2 shows a method for operating the memory system in FIG. 1 according to one embodiment of the present invention.

To address the issue caused by instant threshold voltage shift, a program process with a reprogram scheme can be adopted. FIG. 2 shows a method 200 for operating the memory system 100 according to one embodiment of the present invention. In FIG. 2, the method 200 can include steps S210 to S250.

S210: start;

S220: perform a background media scan to determine a data valid ratio of each of the memory blocks B1 to BK that has been programmed previously;

S230: if the data valid ratio of the memory block BK is determined to be smaller than a threshold value, go to step S232, else go to step S210;

S232: copy valid data stored in the memory block BK;

S234: select a memory block B1 from at least one memory block that has not been programmed previously;

S240: initiate the program process;

S242: perform a first program operation to program the memory block B1;

S244: wait for a delay time after the first program operation is completed;

S246: after waiting for the delay time, perform an all-level threshold voltage test to determine if threshold voltages of the memory cells in the memory block B1 are greater than corresponding threshold voltages;

S248: perform a second program operation to program the memory block B1 according to a result of the all-level threshold voltage test;

S250: perform an erase operation to erase the memory block BK.

In step S220, the background media scan can be performed to determine a data valid ratio of each of the memory blocks B1 to BK that has been programmed previously. If the data valid ratio of a memory block, for example, the memory block BK, is smaller than a threshold value, it may imply that the instant threshold voltage shift has begun to affect the stability of the data stored in the memory block BK. In this case, step S232 to S240 can be performed to move the valid data in the memory block BK to another memory block that has not been programmed yet.

In some embodiments, the background media scan can be performed periodically to check the health condition of each memory block B1 to BK when the memory system is not busy. Also, in some embodiments, there may be more than one block that is determined to have bad health condition. In this case, the block having the smallest data valid ratio will be reprogrammed to another block first.

In step 232, the valid data stored in the memory block BK can be copied, and a memory block, for example, the memory block B1, that has not been programmed previously will be selected in step S234. In this case, the program process will be initiated in step S240 to program the data copied from the memory block BK to the memory block B1.

In FIG. 2, steps S242 to S248 are performed during the program process. In step S242, a first program operation can be performed to program the valid data stored in the memory block BK to the memory block B1. The first program operation may be performed with a plurality of programming voltage pulses to make the threshold voltages of the memory cells MCA(1,1) to MCA(M,N) in memory block B1 reach the desired levels.

After the memory cells MCA(1,1) to MCA(M,N) in memory block B1 have been programmed to have their threshold voltages reach the desired levels, the memory system 100 can wait for a predetermined delay time in step S244, so that the instant threshold voltage shift can be observed. In some embodiments, the delay time can be, for example but not limited to, 1 second.

In step S246, after waiting for the delay time, the memory system can perform the all-level threshold voltage test to determine if the threshold voltages of the memory cells in the memory block B1 are greater than corresponding threshold voltages. That is, the all-level threshold voltage test can check whether the data stored in the memory cells in memory block B1 are still valid.

In step S248, the second program operation can be performed to program the memory block B1 according to the result of the all-level threshold voltage test derived in step S246. That is, memory cells in memory block B1 that have threshold voltages dropped below the desired levels will be programmed again during the second program operation. However, memory cells in memory block B1 having their threshold voltages remaining above the desired levels can be inhibited during the second program operation.

By reprogramming the memory cells having their threshold voltages dropping below the desired levels with the second program operation, the retention error caused by instant threshold voltage shift can be reduced. Furthermore, after being reprogrammed, the memory cells will have better durability against the instant threshold voltage shift. Consequently, the data stored in the memory block B1 can be retained longer, and the data stored in memory block BK can be erased in step S250.

Although in FIG. 2, the program process is initiated according to the result of the background media scan, the program process may also be used to fulfill the common program commands, and is not limited to being performed after the background media scan. Since the program process including steps S424 to S248 can help to reduce the retention error caused by instant threshold voltage shift, it can be adopted whenever the program command occurs. However, since the program process shown in FIG. 2 may require a delay time, the memory system 100 may only initiate the program process when the length of the programming time is not critical to the memory system 100 in some embodiments.

Figure 3:
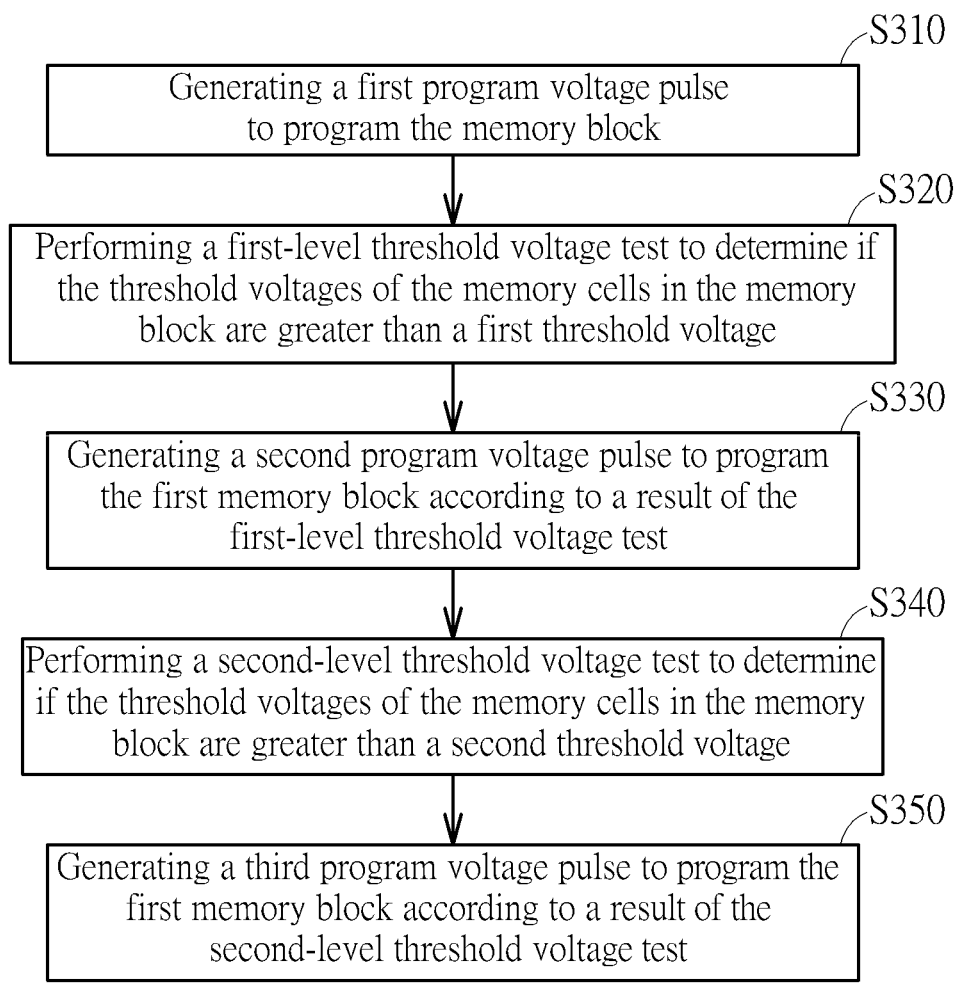
FIG. 3 shows a flow chart of a program operation according to one embodiment of the present invention.

In some embodiments, during the first program operation and the second program operation, the memory system 100 may generate a plurality of program voltage pulses to program the memory cells and increase the threshold voltages of the memory cells. FIG. 3 shows a flow chart of the program operation according to one embodiment of the present invention. In FIG. 3, the program operation can include steps S310 to S350.

S310: generate a first program voltage pulse to program the memory block B1;

S320: perform a first-level threshold voltage test to determine if the threshold voltages of the memory cells MCA(M,1) to MCA(M,N) in the memory block B1 are greater than a first threshold voltage;

S330: generate a second program voltage pulse to program the first memory block according to a result of the first-level threshold voltage test;

S340: perform a second-level threshold voltage test to determine if the threshold voltages of the memory cells MCA(M,1) to MCA(M,N) in the memory block B1 are greater than a second threshold voltage;

S350: generate a third program voltage pulse to program the first memory block according to a result of the second-level threshold voltage test.

In step S310, the memory system 100 can generate a first program voltage pulse through the word lines WLA1 to WLAM to program the memory cells in memory block B1 sequentially. In some embodiments, memory cells coupled to the same word line in the memory block B1 can be programmed simultaneously during the first program operation. For example, the memory cells MCA(1,1) to MCA(1,N) coupled to the word line WLA1 can be programmed at the same time when the word line WLA1 receives the first program voltage pulse, and the memory cells MCA(M,1) to MCA(M,N) coupled to the word line WLAM can be programmed at the same time when the word line WLAM receives the first program voltage pulse.

After the first program voltage pulse is issued in step S310, the first-level threshold voltage test can be performed to determine if the threshold voltages of the memory cells MCA(M,1) to MCA(M,N) in the memory block B1 are greater than a first threshold voltage in step S320. That is, first-level threshold voltage test can be used to check if the memory cells MCA(M,1) to MCA(M,N) have been programmed with the first state of data successfully. Therefore, in step S330, when the second program voltage pulse is generated to program the memory block B1, memory cells that have been programmed with the first state of data successfully will be inhibited while memory cells that have not been programmed with the first state of data successfully will be programmed again.

After being programmed with the second program voltage pulse in step S330, some of the memory cells may have their threshold voltages become greater than the first threshold voltage. In some embodiments, some of the memory cells may even have their threshold voltages become greater than the second threshold voltage, which represents the second state of data. In this case, in addition to repeat the first-level threshold voltage test, the second-level threshold voltage test can be performed to further determine if the threshold voltages of the memory cells MCA(M,1) to MCA(M,N) in the memory block B1 are greater than the second threshold voltage in step S340.

Therefore, in step S350, when the third program voltage pulse is generated to program the memory block B1, memory cells that have been programmed to reach the desired levels of threshold voltages will be inhibited while memory cells that have not been programmed to reach the desired levels of threshold voltages will be programmed one more time.

Furthermore, in some embodiments, to further improve the efficiency of the program operation, the second program voltage pulse can be greater than the first program voltage pulse, and the third program voltage pulse can be greater than the second program voltage pulse. That is, the incremental step pulse programming can be applied.

In some embodiments of the present invention, the program operation may include even more steps similar to steps S340 and S350 to further program the memory cells MCA (M,1) to MCA(M,N) to reach the higher levels of threshold voltages.

In summary, the method for programming a memory system provided by the embodiment of the present invention can perform two times of program operations with a predetermined delay time in between so the retention error caused by instant threshold voltage shift can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for programming a memory system, the memory system comprising a plurality of memory blocks, each comprising a plurality of memory cells, the method comprising:
    performing a background media scan to determine a data valid ratio of a second memory block that has been programmed previously;
    when the data valid ratio of the second memory block is determined to be smaller than a threshold value:
        copying valid data stored in the second memory block;
        selecting a first memory block of the plurality of memory blocks that has not been programmed; and
        initiating a program process; and
    during the program process:
        performing a first program operation to program the first memory block;
        waiting for a delay time after the first program operation is completed;
        after waiting for the delay time, performing an all-level threshold voltage test to determine if threshold voltages of memory cells in the first memory block are greater than corresponding threshold voltages; and
        performing a second program operation to program the first memory block according to a result of the all-level threshold voltage test.

2. The method of claim 1, wherein performing the first program operation to program the first memory block of the plurality blocks of memory cell comprises programming the valid data stored in the second memory block to the first memory block.

3. The method of claim 1, further comprising performing an erase operation to erase the second memory block.

4. The method of claim 1, wherein the background media scan is performed periodically.

5. The method of claim 1, wherein performing the second program operation to program the first memory block according to the result of the all-level threshold voltage test comprises:
    during the second program operation, inhibiting memory cells in the first memory block that pass the all-level threshold voltage test.

6. The method of claim 1, wherein the program process is initiated when a length of a programming time is not critical to the memory system.

7. The method of claim 1, wherein the first memory block are coupled to different word lines, and memory cell coupled to a same word line in the first memory block are programmed simultaneously during the first program operation and the second program operation.

8. The method of claim 1, wherein the memory system is a NAND flash memory system.

9. A method for programming a memory system, the memory system comprising a plurality of memory blocks, each comprising a plurality of memory cells, the method comprising:
    during a program process:
        performing a first program operation to program a first memory block of the plurality of memory blocks, the first program operation comprising:
            generating a first program voltage pulse to program the first memory block;
            performing a first-level threshold voltage test to determine if threshold voltages of the first memory block are greater than a first threshold voltage;
            generating a second program voltage pulse to program the first memory block according to a result of the first-level threshold voltage test;
            performing a second-level threshold voltage test to determine if the threshold voltages of the first memory block are greater than a second threshold voltage greater than the first threshold voltage; and
            generating a third program voltage pulse to program the first memory block according to a result of the second-level threshold voltage test;

waiting for a delay time after the first program operation is completed;

after waiting for the delay time, performing an all-level threshold voltage test to determine if threshold voltages of memory cells in the first memory block are greater than corresponding threshold voltages; and performing a second program operation to program the first memory block according to a result of the all-level threshold voltage test.

10. The method of claim 9, wherein the third program voltage pulse is greater than the second program voltage pulse, and the second program voltage pulse is greater than the first program voltage pulse.

11. A method for programming a memory system, the memory system comprising a plurality of memory blocks, each comprising a plurality of memory cells, the method comprising:

during a program process:

performing a first program operation to program a first memory block of the plurality of memory blocks;

waiting for a delay time after the first program operation is completed;

after waiting for the delay time, performing an all-level threshold voltage test to determine if threshold voltages of memory cells in the first memory block are greater than corresponding threshold voltages; and performing a second program operation to program the first memory block according to a result of the all-level threshold voltage test, the second program operation comprising:

generating a first program voltage pulse to program the first memory block;

performing a first-level threshold voltage test to determine if threshold voltages of the first memory block are greater than a first threshold voltage;

generating a second program voltage pulse to program the first memory block according to a result of the first-level threshold voltage test;

performing a second-level threshold voltage test to determine if the threshold voltages of the first memory block are greater than a second threshold voltage greater than the first threshold voltage; and generating a third program voltage pulse greater than the second program voltage pulse to program the first memory block according to a result of the second-level threshold voltage test.

12. The method of claim 11, wherein the third program voltage pulse is greater than the second program voltage pulse, and the second program voltage pulse is greater than the first program voltage pulse.

* * * * *